United States Patent
Skuruls

(10) Patent No.: US 8,121,302 B2
(45) Date of Patent: Feb. 21, 2012

(54) METHOD OF CORRECTION OF ACOUSTIC PARAMETERS OF ELECTRO-ACOUSTIC TRANSDUCERS AND DEVICE FOR ITS REALIZATION

(75) Inventor: Raimonds Skuruls, Jaunvilani (LV)

(73) Assignee: Real Sound Lab, SIA, Riga (LV)

( * ) Notice: Subject to any disclaimer, the term of this patent is extended or adjusted under 35 U.S.C. 154(b) by 1129 days.

(21) Appl. No.: 11/920,602

(22) PCT Filed: Dec. 14, 2005

(86) PCT No.: PCT/LV2005/000014
§ 371 (c)(1),
(2), (4) Date: Nov. 16, 2007

(87) PCT Pub. No.: WO2006/123923
PCT Pub. Date: Nov. 23, 2006

(65) Prior Publication Data
US 2009/0103741 A1   Apr. 23, 2009

(30) Foreign Application Priority Data

May 18, 2005   (LV) .................................. P-05-60

(51) Int. Cl.
*H04R 29/00* (2006.01)

(52) U.S. Cl. .............. 381/59; 381/92; 381/111; 381/97; 381/98; 381/99; 381/56; 381/101; 381/102; 381/103; 381/312

(58) Field of Classification Search .............. 381/59, 381/92, 111, 97, 98, 99, 56, 101, 102, 103, 381/312
See application file for complete search history.

(56) References Cited

U.S. PATENT DOCUMENTS

| | | | |
|---|---|---|---|
| 4,209,672 A | | 6/1980 | Nitta et al. |
| 4,628,530 A | | 12/1986 | Op De Beek et al. |
| 4,909,064 A | * | 3/1990 | Talmadge ............... 73/1.82 |
| 5,581,621 A | | 12/1996 | Koyama et al. |
| 5,761,295 A | | 6/1998 | Knappe et al. |
| 6,175,489 B1 | * | 1/2001 | Markow et al. ......... 361/679.23 |

(Continued)

FOREIGN PATENT DOCUMENTS

EP   0 624 947 A2   11/1994

(Continued)

OTHER PUBLICATIONS

S.J. Yang and A.J. Ellison, Machinery Noise Measurement, 1985, pp. 2-4, Oxford U. Press, New York, USA.

(Continued)

*Primary Examiner* — A O Williams
(74) *Attorney, Agent, or Firm* — Amster, Rothstein & Ebenstein LLP

(57) ABSTRACT

A device and method for improving the performance of an electro-acoustic transducer. An acoustic test signal is generated through the electro-acoustic transducer. The acoustic test signal is measured at multiple points on an ambient surface around the electro-acoustic transducer to create measured acoustic data. Based on the measured acoustic data, an acoustic power frequency response of the electro-acoustic transducer is calculated. A correction impulse response for the electro-acoustic transducer is determined based on the acoustic power frequency response. A correction filter applies the correction impulse response to a sound signal input to generate a sound signal output for playback through the electro-acoustic transducer.

30 Claims, 8 Drawing Sheets

U.S. PATENT DOCUMENTS

| | | | |
|---|---|---|---|
| 6,434,085 B1 * | 8/2002 | Nedwell | 367/100 |
| 6,760,451 B1 * | 7/2004 | Craven et al. | 381/98 |
| 7,068,796 B2 * | 6/2006 | Moorer | 381/92 |
| 7,113,447 B1 * | 9/2006 | Matthews et al. | 367/7 |
| 7,535,820 B2 * | 5/2009 | Hayashi | 370/208 |
| 2002/0141595 A1 * | 10/2002 | Jouppi | 381/2 |
| 2003/0233229 A1 * | 12/2003 | Tseng et al. | 704/212 |
| 2005/0265544 A1 * | 12/2005 | Imata | 379/406.08 |
| 2008/0318518 A1 * | 12/2008 | Coutinho et al. | 455/3.06 |
| 2010/0189282 A1 * | 7/2010 | Bharitkar et al. | 381/97 |
| 2010/0310092 A1 * | 12/2010 | Bharitkar et al. | 381/99 |

FOREIGN PATENT DOCUMENTS

| | | |
|---|---|---|
| EP | 0 624 947 B1 | 8/2003 |
| WO | PCT/LV2005/000014 | 7/2006 |

OTHER PUBLICATIONS

Jeffrey A. Rocha, "The Ambiguous Frequency Response: The BDPR, Not the Axial Response, Depicts How a Given LoudSpeaker will Perform in an Actual Listening Environment." Sound & Video Contractor, Jul. 1, 1997, pp. 1-4, http://svconline.com/mag/avinstall_ambiguous_frequency_response/.

Angstrom Loudspeakers, "Choosing A Speaker, " pp. 1-2, http://www.angstromloudspeakers.com/docs/choosing_speaker_2.htm (last visited Nov. 27, 2007).

David Fabrikant, "Swan 4.1, 5.1 vs Mirage Omni 250s!," vBulletin v3.5.4, Feb. 14, 2005, Jelsoft Enterprises Ltd., http://www.hometheaterforum.com/htf/archive/index.php/t-205474.html.

* cited by examiner ceived sound parameters is transformed from analogue form to a digital form. The acquired result is exposed to the Fourier Transform, afterwards modified into absolute value, logarithmed and further filtered in order to eliminate the effect of interference and thus to increase the accuracy of loudspeaker parameters' measurements. Finally, the acquired result is transformed into analogue form and written in memory accordingly, hereto the acquired result is being written repeatedly by back playing the test signal from the generator in certain time interval. Disadvantage of the given method lies in the fact that the measurements used for adjustment do not reflect the sound distortions of the electro-acoustic system and filtration process does not differentiate sound distortions created by the electro-acoustic system from the ones created by the room. Thus, the calculated adjustment is inaccurate and the result of adjustment creates worse sound than before its making.

An acoustic signal correction device is described in U.S. Pat. No. 5,581,621 to Koyama et al. (issued Dec. 3, 1996, entitled "Automatic adjustment system and automatic adjustment method for audio devices", IPC H03G 5/00). The device contains memory device for equalizer data keeping, audio device with programmable equalizer that selectively modifies audio signal accordingly to the equalizer data, and the audio signal analyzer that generates bench signal which keeps in its memory a pattern profile of the preferable frequency response to which the audible sound output signal is being compared. Hereto, the signal analyzer is connected to programmable equalizer and audio device, but audio device generates audible sound signal according to bench signal. Besides, the acoustic signal correction device contains tools for automatic equalizer data correction according to collation results. Memory device keeps in memory frequency response pattern profile and adjustment results. Equalizer also contains tools that divide output signal into sub-ranges of many frequencies. Disadvantage of the given range lies in the fact that the measurements used for the correction of acoustic signals do not reflect the sound distortions of electro-acoustic system, the result of adjustments creates worse sound than before their making.

The technical solution described in EP 0 624 947 B1 to Yamaha Corporation (granted Aug. 27, 2003, entitled "Acoustic characteristic correction device," IPC H03G 5/16) is an acoustic characteristic correction device consisting of:

Measuring block that includes Measuring Section consisting of: Signal Source with test signals written in memory, amplifier, playback device, measuring device, amplifier of tested signal, registrar that fixes received signals from the mentioned measuring device as well as includes processing part for determination of correction parameters; and Correction block that includes Control Section with correction parameters written in memory and Realization Block for entering the required parameters.

Optimal parameters for concrete needs are supplied by making correction in zones, dividing frequency range in zones, wherein one end of the zone covers beginning of others. Disadvantage of the known device lies in its limited functional options, insufficient measurement precision of electro-acoustic transducer and relatively bad sound of corrected playback signal. The relatively bad sound of corrected playback signal is related to the fact that the correction characteristics are defined inaccurately. The reasons are as follows: Firstly, the measurements used for correction of acoustical signals do not display real problems of sound quality perceived by the listener. Secondly, adequate correction parameters are evaluated subjectively by participation of

METHOD OF CORRECTION OF ACOUSTIC PARAMETERS OF ELECTRO-ACOUSTIC TRANSDUCERS AND DEVICE FOR ITS REALIZATION

CROSS-REFERENCE TO RELATED APPLICATION

This is a U.S. national stage entry under 35 U.S.C. §371 of International Application No. PCT/LV2005/000014, filed on Dec. 14, 2005 and published in English as International Publication No. WO 2006/123923 A1 under the Patent Cooperation Treaty, which claims priority to Latvian Application No. P-05-60, filed on May 18, 2005.

FIELD OF INVENTION

This invention relates to the field of acoustics, in particular to methods and devices of correction of acoustic parameters of electro-acoustic transducers and can be applied for improvement of playback parameters of acoustic signals of various electro-acoustic transducers.

BACKGROUND

There are known devices and methods for correction of acoustic parameters of electro-acoustic transducer by using measurements of acoustic parameters of electro-acoustic transducers where correction is performed both automatically and with participation of sound operator. Disadvantage of the known technical solutions is relatively low precision of measuring and poor quality of correction results.

It is known that human ear perceives information about sound timbre from direct sound, namely, the sound coming directly from acoustic transducer and early reverberation of the sound that reaches listener in first 30 ms after direct sound but ignores other sound reverberation. Up to now used measuring devices do not differentiate and separate direct sound waves and early reverberation of sound waves from posterior reverberation of sound waves.

The conventional technical solutions for correction of acoustic parameters of electro-acoustic transducer that are based on evaluation results of sound pressure caused by electro-acoustic transducer do not reflect real problems of playback of electro-acoustic transducer. Also, sound pressure frequency responses vary greatly depending on where the sound pressure caused by the electro-acoustic transducer is evaluated. Hence, the operator using the conventional technical solution faces an insoluble problem of having to select which of acquired sound pressure frequency responses to be used and which of parameters additionally to be corrected manually or to be processed differently. Because there is no specified algorithm for obtaining correction, this process starts to resemble art. Furthermore, using these measuring results for correction of acoustic parameters of electro-acoustic transducer, new sound distortions are created because there is attempt to correct the interference expression of sound waves in certain place of the room in known technical solutions. Thus, that kind of correction of acoustic parameters of electro-acoustic transducer is incorrect and inadequate to eliminate the transmission distortions and irregularities of electro-acoustic transducer.

There is known method of measuring the parameters of loudspeaker, as described in U.S. Pat. No. 4,209,672 to Nitta et al. (issued Jun. 24, 1980, entitled "Method and apparatus for measuring characteristics of a loudspeaker", IPC H04R 29/00), according to which the measuring result of a peroperator that causes doubts about the objectivity of correction And, thirdly, the known technical solution divides frequency range into relatively broad zones that decrease the number of samples on the frequency axis, thus losing information about the change in characteristics of frequency response on the frequency axis.

SUMMARY OF THE INVENTION

It is an object of the present invention is to overcome the above described shortcomings of the conventional technical solutions and to increase playback quality of acoustic signal of various electro-acoustic transducers, to increase precision and speed of corrections of acoustic parameter of electro-acoustic transducer related to it, as well as to increase the validity of automatic correction with minimal participation of the operator.

It is another object of the present invention to provide a method of correcting acoustic parameters of electro-acoustic transducer comprising the steps of measuring of the acoustic parameters of electro-acoustic transducer on the ambient surface of the electro-acoustic transducer or its segment, acquiring the measurement results from many discrete points of this surface or segment, processing of the acquired measurement results, calculation of acoustic power frequency response of electro-acoustic transducer according to the processing measurement results of the acoustic parameters of electro-acoustic transducer, and determining the correction parameters of electro-acoustic transducer with the help of acoustic power frequency response of electro-acoustic transducer and acoustic signal correction.

Other objects of the present invention include:

Evaluation of acoustic power frequency response of electro-acoustic transducer acquired by moving the measuring device consecutively from one discrete point of the electro-acoustic transducer's ambient surface to another, making measurements at the interval of 0.2 to 3.2 seconds and by using test signal whose duration is within boundaries of 0.05 to 3.2 seconds.

In the site of evaluations of acoustic power frequency response of electro-acoustic transducer where one lower horizontal reflective surface is dominating, electro-acoustic transducer's acoustic parameters are measured on the segment of electro-acoustic transducer's ambient surface, one side of which collides with the lower horizontal reflective surface, wherein the measurements' surface is perpendicular the direction to the electro-acoustic transducer whose parameters; are being measured.

To evaluate acoustic power frequency response of electro-acoustic transducer in the site where there are several dominating surfaces, measurements are being made along the lines that connect randomly chosen point on the lower horizontal reflective surface with randomly chosen point on every other reflective surface in the acoustic environment.

To evaluate acoustic power frequency response of electro-acoustic transducer in the site where surfaces have complicated configuration, measurements are made along imaginary circle, which is placed in a vertical plane, athwart the direction to the electro-acoustic transducer, and along horizontal diameter and vertical diameter of this imaginary circle.

To evaluate acoustic power frequency response of electro-acoustic transducer in a small room with parallel walls, measurements in the room are made cornerwise from its symmetry centre to the corners of the room that are farthest from the electro-acoustic transducer.

Impulse response of each particular discrete measurement is processed by Window Function, wherein the width of Window Function is chosen to be 0.04 to 0.12 seconds.

Evaluation of acoustic power frequency response of electro-acoustic transducer is smoothed in scale of logarithmic frequency. For example, evaluation of acoustic power frequency response may be smoothed by smoothing function of cosine impulse.

It is yet another object of the present invention to provide a device for realization of correction of acoustic parameter of electro-acoustic transducer comprising:

Measuring System that contains Measuring Section comprising signal sources with test signals written in memory for generation of the test signals, amplifier of playback signals, measuring devices, amplifier of tested signals, a memory that records received signals from the measuring device and stores as measured acoustic data, output of Measuring Section, as well as measurements processing section for determination of correction parameters and Interface Block; and Corrector Comprising Control Section with Correction Parameters Written in Memory and Realization Block of Correction.

More specifically, the measurements processing section comprises: impulse Response Calculation Block for performing of convolution operation between output signal of Measuring System and inverse Spectrum Function Block to calculate impulse response, Window Function block that multiplies samples of impulse response signals with samples of Window Function in order to exclude effect of interfering components, Fast Fourier Transform block that computes Fast Fourier Transform from impulse response signal, defining frequency sample data array on each separate impulse response, synchronization block that synchronizes the beginning of input data of Fast Fourier Transform with highest values of impulse response, memory that stores data array of frequency samples, Acoustic Power Frequency Response Calculation block that calculates acoustic power frequency response from the mentioned data array of frequency samples, re-sampling block that converts acoustic power frequency response from linear scale to logarithmic scale, display for displaying the calculated acoustic power frequency response, block that defines correction levels at the range ends of acoustic power frequency response, smoothing block for acoustic power frequency response for eliminating the effects of small irregularities and interferences of acoustic power frequency response, re-sampling block for converting power frequency response from logarithmic scale to linear scale, inverter for calculation of inverse value of power frequency response samples, Filtration Block for power frequency response samples for obtaining finite impulse response of corrector, inverse Fast Fourier Transform calculation block that calculates samples of impulse response of correction and sends data to normalized samples calculation block of impulse response. In the Corrector, the Realization Block calculates the convolution operation between sound signal input and impulse responses of correction (i.e., correction parameters) from Control Section, and sends the obtained calculation result to Sound Signal Output.

The device, in addition, may further comprise block for calculation of average value of synchronized impulse responses, a block for calculation of time delay of groups, smoothing block of group delay, block for calculation of phase corrector of frequency response from time delay frequency response and a block that adjusts the phase of acoustic power frequency response by multiplying the respective sample of acoustic power frequency response with the respective sample of phase frequency response in complex form. The device can also contain several correctors.

These and other features of the present invention are described in, or are apparent from, the following detailed description of various exemplary embodiments of this invention.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF THE PREFERRED EMBODIMENTS

Figure 3:
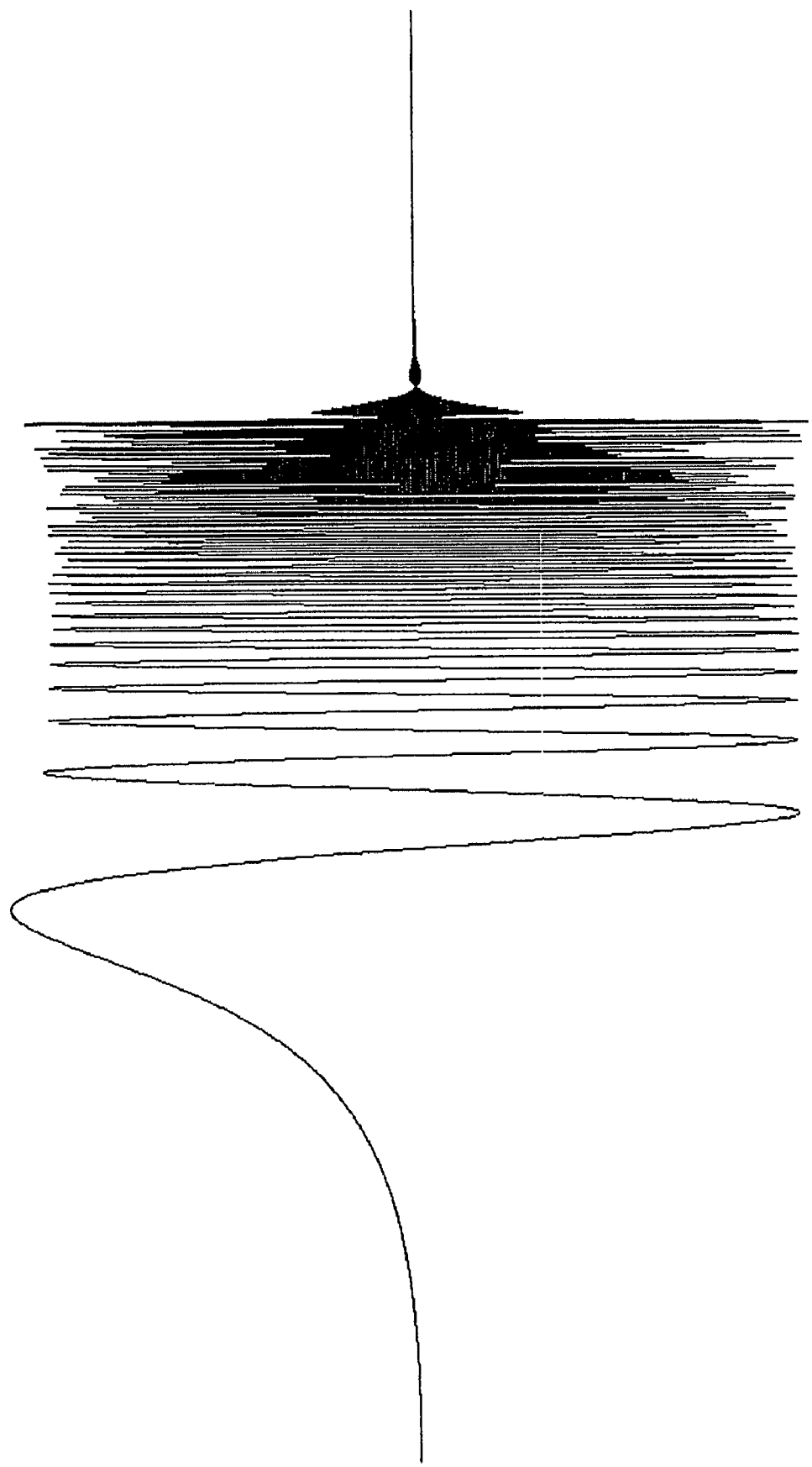
FIG. 3 illustrates an exemplary form of the acoustic test signal.
Figure 4:
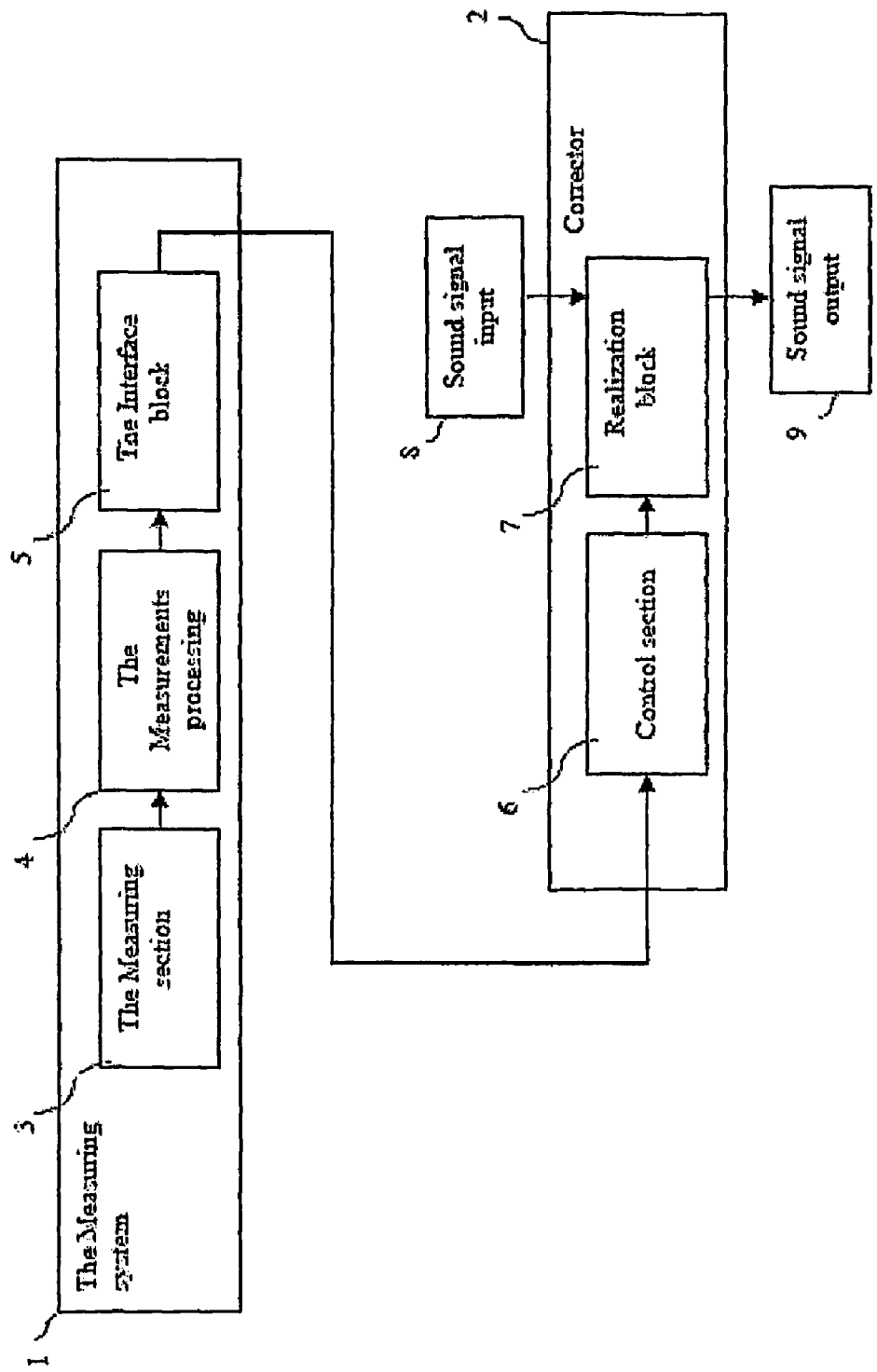
FIG. 4 is a total block diagram of correction device for an exemplary embodiment of the present invention.
Figure 5:
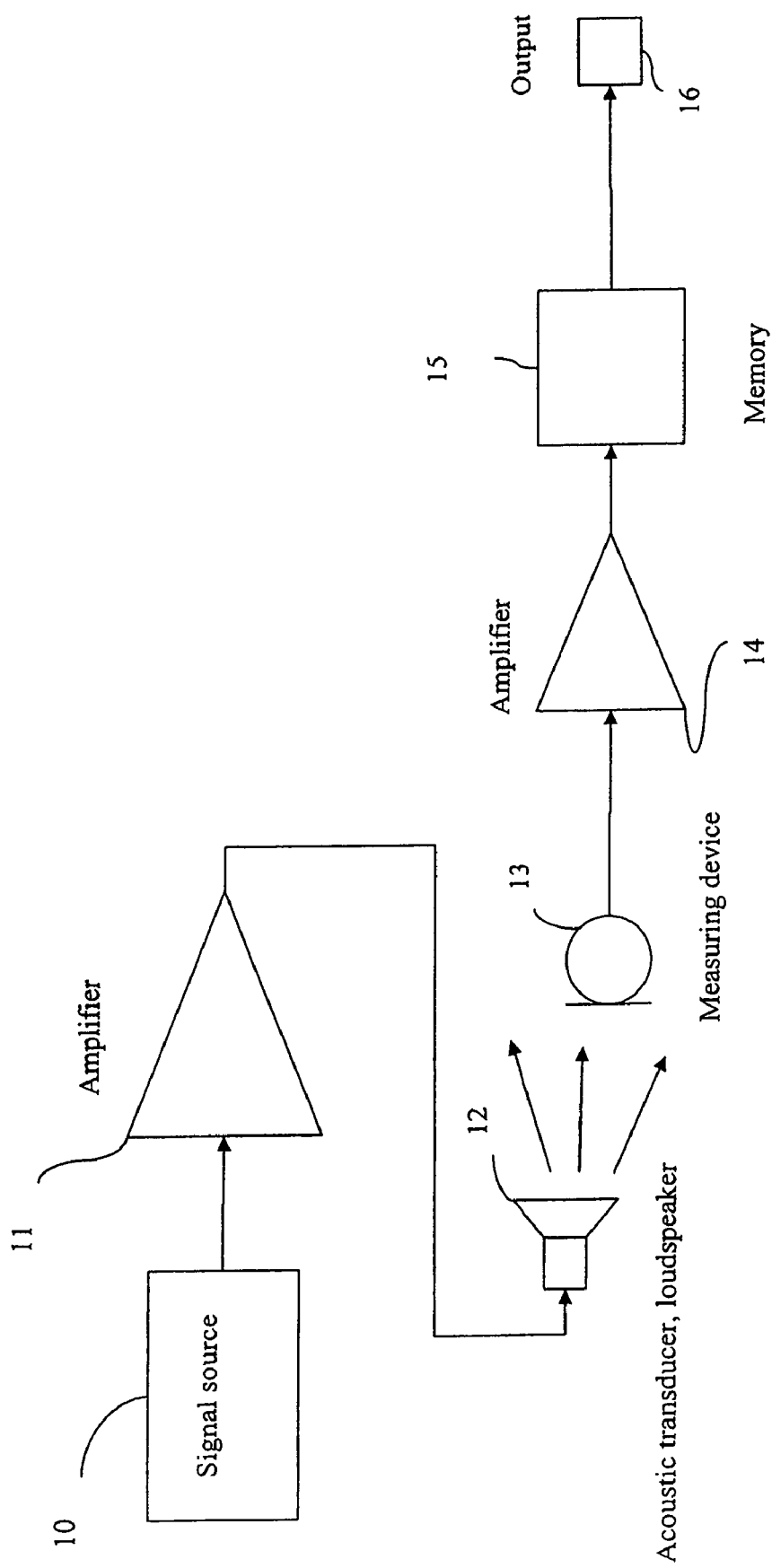
FIG. 5 is a detailed block diagram of Measuring Section of Measuring System in the electro-acoustic transducer correction device of the exemplary embodiment.

In an exemplary embodiment of the present invention, the correction of acoustic parameters of electro-acoustic transducer is made by the device described in FIG. 4 that comprises Measuring System 1 and at least one corrector 2, wherein Measuring System 1 comprises Measuring Section 3, the measurements processing section 4 and Interface Block 5, and corrector 2 comprises Control Section 6, and Realization Block 7. Sound Signal Input 8 goes into Realization Block 7, from which Sound Signal Output 9 is generated. The correction of acoustic parameters of electro-acoustic transducer is made by this exemplary embodiment as follows:

Schematically described Signal Source 10 (FIG. 5) with acoustic test signals written in memory repeatedly plays back acoustic test signal whose spectrum is balanced with interference spectrum in the site of measurements. Therefore, test signal is being chosen with higher energy spectrum in the lower frequency area, where the interference energy is higher, as well as such that has enough small highest value relation with average value. In this exemplary embodiment of the present invention, signal for which the signal/noise relation in range of 20 to 30 dB can be obtained is selected. The chosen duration of played test signal (FIG. 3) is 0.05 seconds.

Figure 1A:
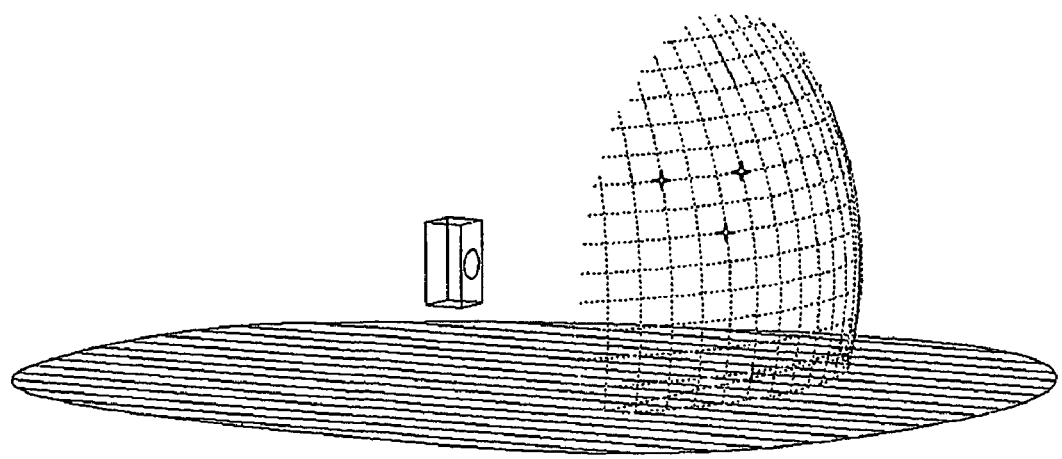
FIG. 1A illustrates a scheme of discrete point disposition for measuring of acoustic parameters of electro-acoustic transducer in the site with one dominating surface—the lower horizontal reflective surface.
Figure 1B:
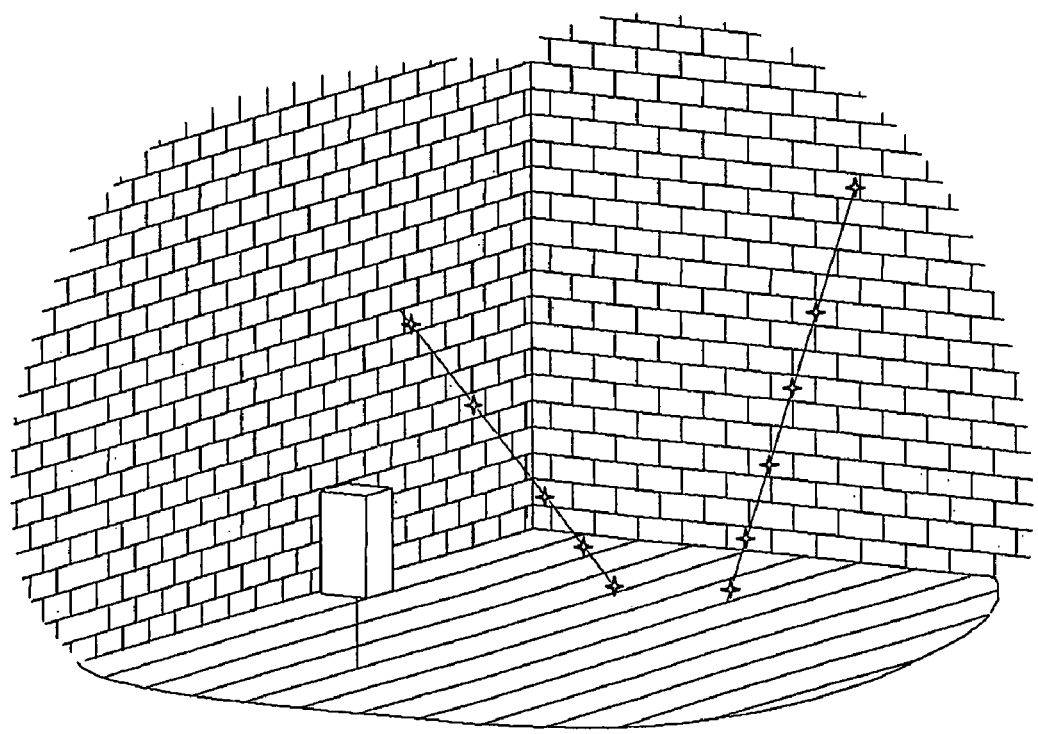
FIG. 1B illustrates alternative scheme of discrete point disposition for measuring acoustic parameters of electro-acoustic transducer in the site where there are several dominating reflective surfaces.
Figure 2A:
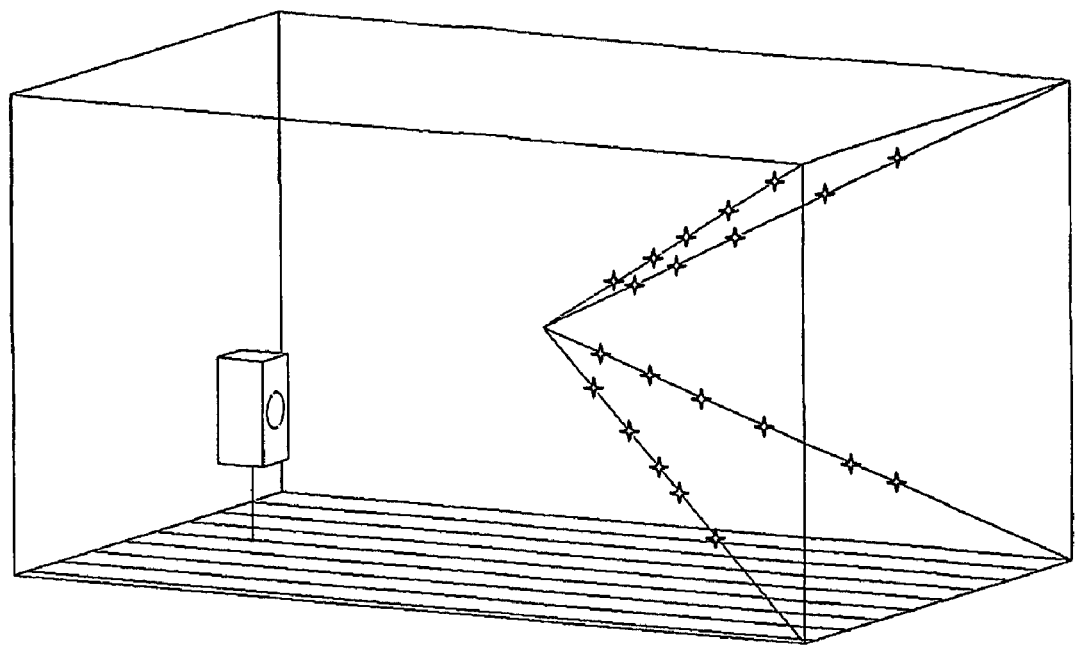
FIG. 2A illustrates alternative scheme of discrete point disposition for measuring acoustic parameters of electro-acoustic transducer in relatively a small room with parallel walls.
Figure 2B:
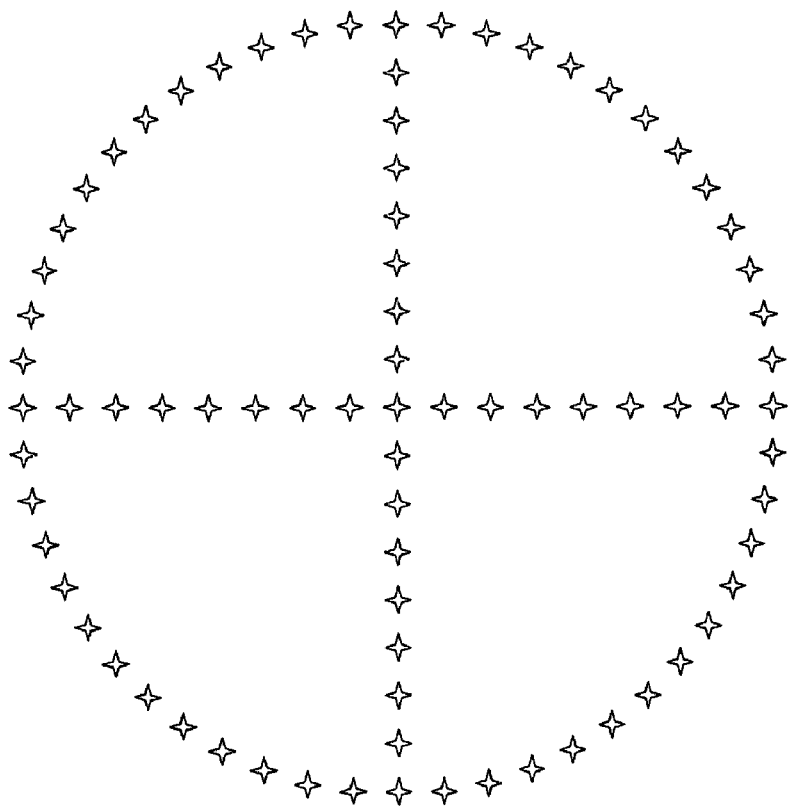
FIG. 2B illustrates alternative scheme of discrete point disposition for measuring acoustic parameters of electro-acoustic transducer in the site where reflective surfaces have complicated configurations.

Further, the played acoustic test signal is amplified with amplifier 11 and is played through electro-acoustic transducer 12 that is correctable electro-acoustic transducer. Measuring device 13 measures the played acoustic test signal in multiple discrete points of acoustic environment around the electro-acoustic transducer at 0.4 second time interval. Hereto, the multiple measurements are taken on segment of ambient surface around the electro-acoustic transducer by evenly moving the measuring device from one measuring point to another, as shown schematically in FIG. 1A. For taking measurements of acoustic parameters of electro-acoustic transducer in the room with several asymmetrically placed dominating reflective surfaces, the measuring device is moved along lines that connect point on the floor with the point on dominating reflective surface of each room, as shown in FIG. 1B. For taking measurements of parameters of electro-acoustic transducer in the room with parallel walls, the measuring device is moved cornerwise, as shown in FIG. 2A, from symmetry centre to corners of the room farthest from the electro-acoustic transducer. For taking measurements of parameters of electro-acoustic transducer in the room where reflective surfaces have complex configuration or where taking of measurements is complicated by objects present in the room, the measuring device is moved, as shown in FIG. 2B, along imaginary circle, which is placed in a vertical plane, athwart the direction to the electro-acoustic transducer, and along horizontal diameter and vertical diameter of this imaginary circle.

Figure 6:
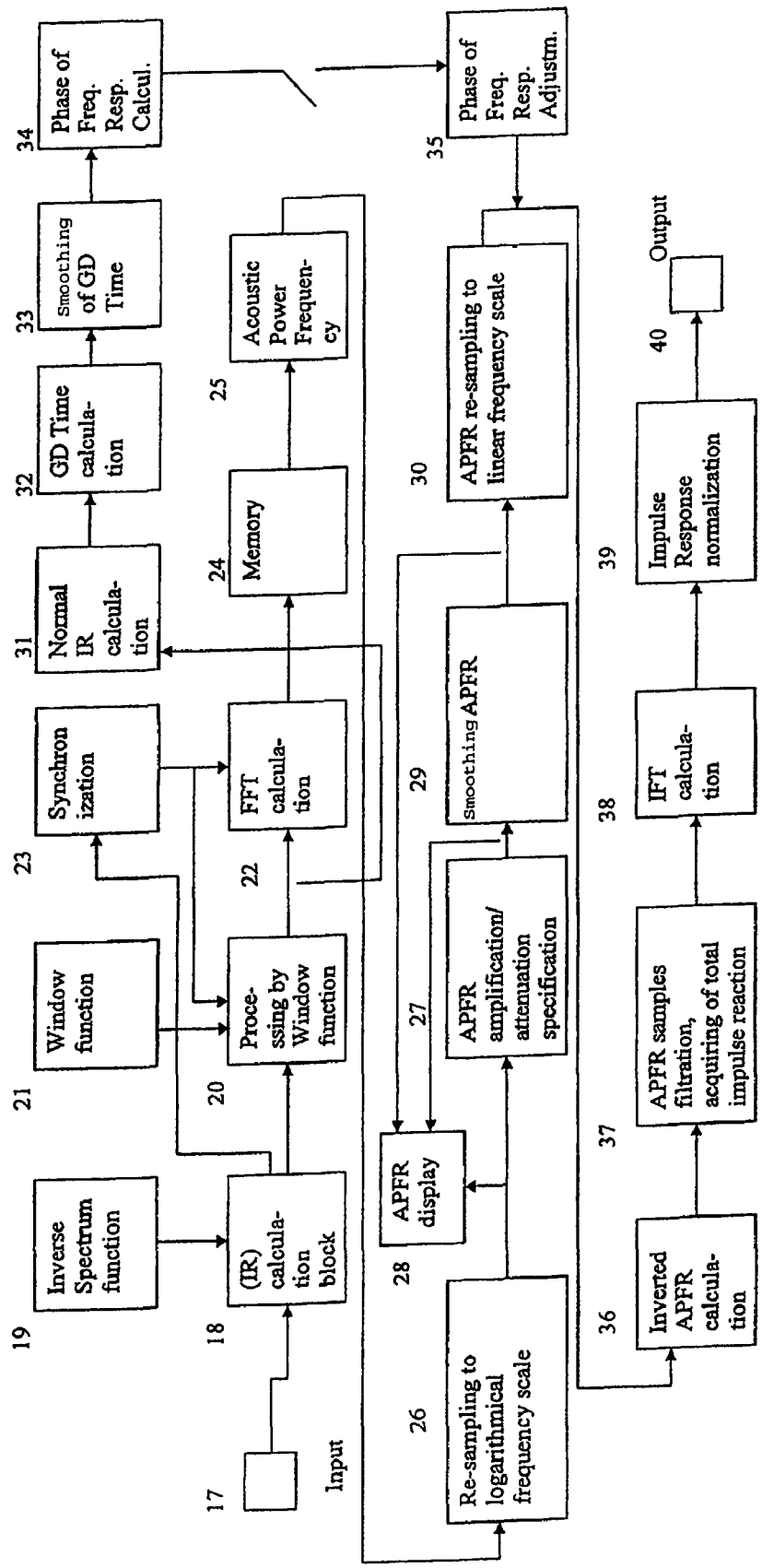
FIG. 6 is a detailed block diagram of Measurements Processing Section of Measuring System in the electro-acoustic transducer correction device of the exemplary embodiment.
Figure 7:
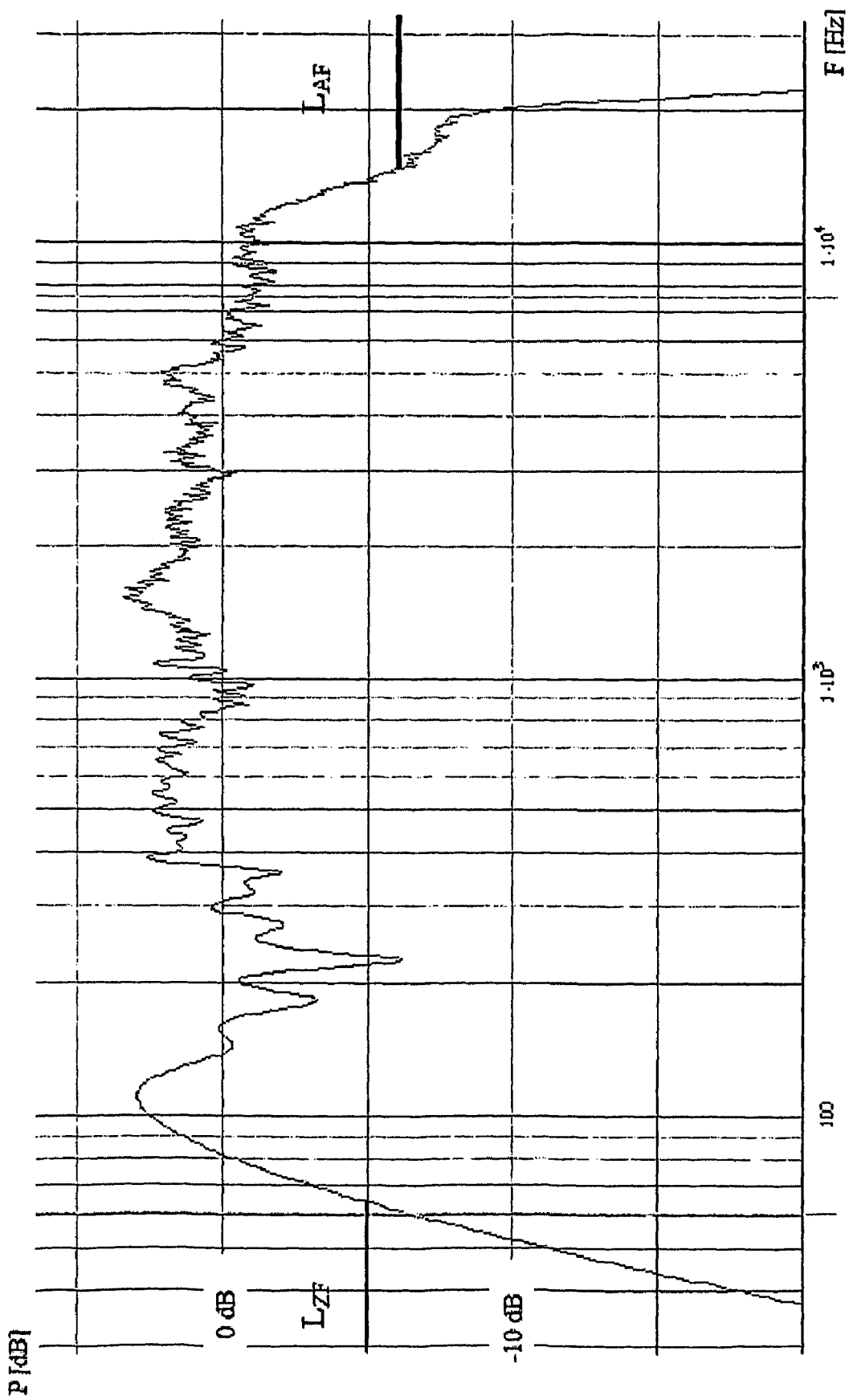
FIG. 7 shows an example of acoustic power frequency response with indicated amplifications/decay of the ends.

Further, acoustic test signal measured by Measuring Device 13 is processed by Amplifier 14, and measured acoustic data from all signals obtained at measuring points is stored in Memory 15. Output 16 of Measuring Section 3 is entered in Input 17 of Measurement Processing Section 4 for calculation of parameters of Correction Filter (FIG. 6). Further, signal is entered in the Impulse Response Calculation Block 18 for performing convolution operation between signal of output 16 of Measuring Section 3 and Inverse Spectrum Function stored in the Inverse Spectrum function block 19 in order to calculate impulse responses of electro-acoustic transducer in the measuring points. Further, signal is entered in Window Function processing block 20 in order to exclude distortion factors such as non-linear and reverberation effects. Window Function processing block 20 multiplies samples of impulse response signals with samples of Window Function stored in memory 21.

Window Function is utilized so that at the highest values of impulse response, Window Function is 1, but at the lowest impulse response values, the Window Function is leaning towards 0 thus excluding from the measurements interference factors, such as non-linearity and reverberation. With Window Function that is longer in time, higher distinction of measurements in the area of low frequency is possible, although, as a result, the effect of reverberation increases. On the other hand, with Window Function that is shorter in time, the impact of room decreases, although information about the lower frequency area starts to disappear.

After the processing of signal in Window Function processing block 20, the acquired results are entered in Fast Fourier Transform block 22 that calculates Fast Fourier Transform from the impulse response signal to determine frequency sample array for each separate impulse reaction response. Synchronization block 23 coordinates the beginning of Fast Fourier Transform input array with highest value of impulse response. The acquired data is then entered in the Memory 24 that stores frequency sample array. Acoustic Power Frequency block 25 calculates the acoustic power frequency response from the frequency sample array. Re-sampling Block 26 transforms acoustic power frequency response from linear frequency scale into logarithmic frequency scale. The calculated acoustic power frequency response may be displayed in Display 28. Afterwards, the calculation results are entered in block 27 that determines the correction levels (see FIG. 8) at the range ends of acoustic power frequency response. The range-end correct levels in the lower frequency area ($L_{ZF}$) and in the high frequency area ($L_{AF}$) are respectively chosen depending on correctable electro-acoustic transducer's ability to play back lower and high frequency signals without overload. In this exemplary embodiment of the invention, the correction levels at the range ends are chosen to be at −5 dB in the area of lower frequency and at −6 dB in the area of high frequency, respectively.

Figure 8:
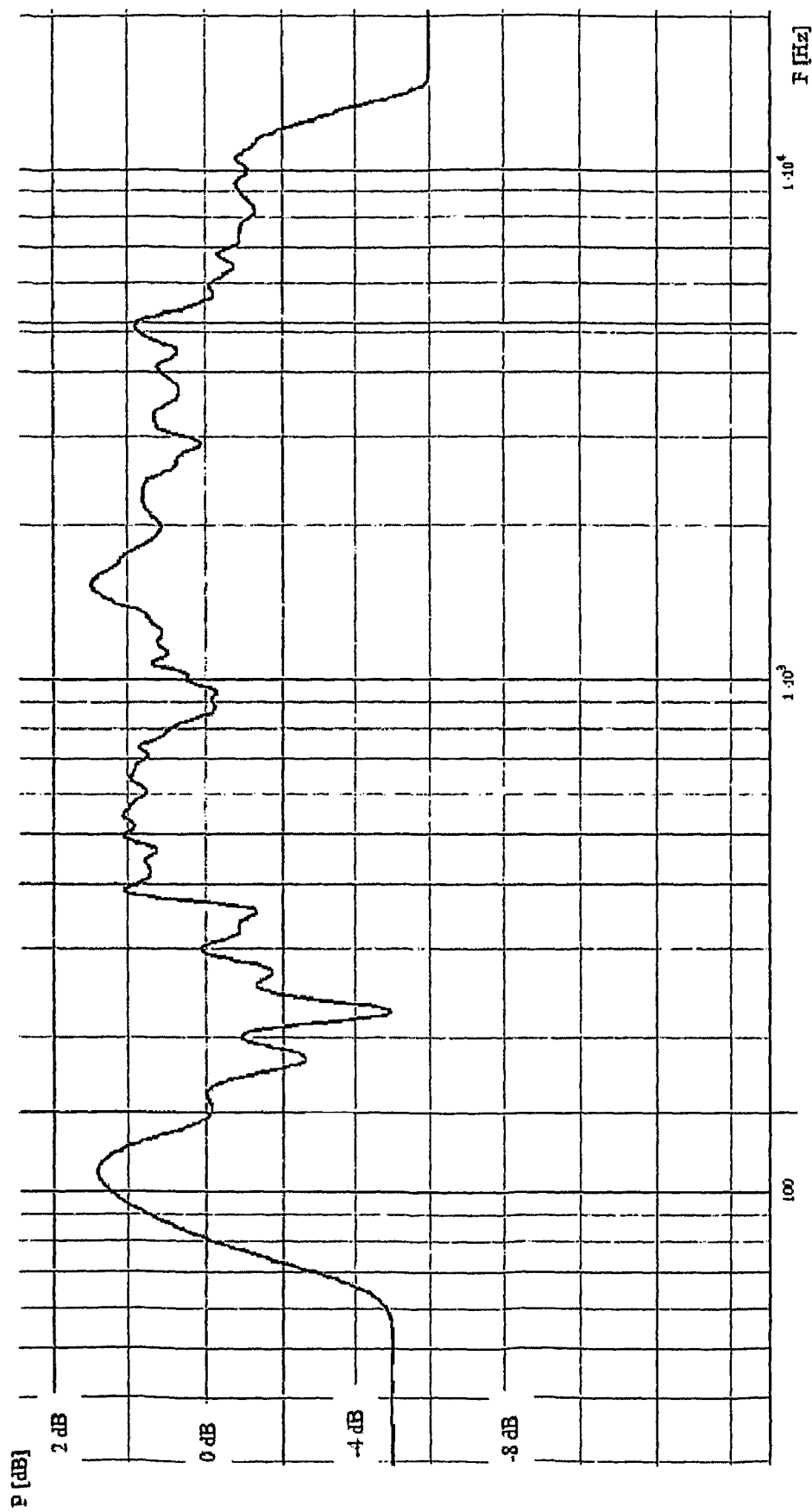
FIG. 8 shows an example of smoothed acoustic power frequency response under the present invention.

Further, the calculation results are entered in Acoustic Power Frequency Response Smoothing Block 29 for eliminating the effect of small irregularities and interference in the acoustic power frequency response (see FIG. 8). Re-sampling Block 30 converts power frequency response from logarithmic scale to linear scale. In addition, before signals are entered in the Fast Fourier Transform Block 22, the acquired results are also entered in block 31 that calculates the average value of synchronized impulse response. The calculated results are sent to block 32 for calculation of Group Delay Time, the output from which is further processed by the Group Delay Smoothing Block 33. The processed results are then entered in block 34 that calculates Phase Frequency Response of corrector 2 from group delay time frequency response. Phase Frequency Response Adjustment block 35 then corrects acoustic power frequency response phase by multiplying the respective acoustic power frequency response sample with the respective phase frequency response sample in complex form. The corrected acoustic power frequency response is then sent to Inverter 36 which calculates inverse value of acoustic power frequency response sample. Afterwards, the acquired results are sent to Power Frequency Response Sample Filtration Block 37 for acquiring finite impulse response of corrector 2, which is afterwards sent to Inverse Fast Fourier Transform calculation block 38. Inverse Fast Fourier Transform calculation block 38 calculates correction impulse response samples of corrector 2 and sends data to Impulse Response Normalized Sample Calculation Block 39. The measurements processing section 4 then outputs its calculated and processed results through Output 40 to Interface Block 5. Interface Block 5 saves the correction impulse response sample array received from the measurements processing section 4, which is afterwards sent to corrector 2. Control Section 6 in corrector 2 saves different correction impulse responses. From Control Section 6, acquired results go into Realization Block 7. Realization Block 7 calculates convolution operation between the signal of Sound Signal Input 8 and the correction impulse response received from the Control Section 6. Further, the correction result is channeled to Sound Signal Output 9, wherefrom it is sent to the amplifier and the respective electro-acoustic transducer for playback. A skilled person in the field would understand that the foregoing exemplary embodiment of the present invention can be implemented by various means, including software, hardware, or a suitable combination thereof.

Constant transmission coefficient between input signal of corrector and reflected acoustic power of electro-acoustic transducer on different working frequencies is reached by making corrections of electro-acoustic transducer with the method and device in accordance with the above-described exemplary embodiment of the present invention. Besides, unlike the conventional technical solutions, the present invention provides undistorted power of sound Signal Source transmission to acoustic power In addition, under the present invention, deep correction of timbre distortions of electro-acoustic transducer does not make new sound defects, and, as a result, timbraly distortion-free, natural sound can be obtained in various acoustic environments.

It is to be understood that while certain forms of the present invention have been illustrated and described herein, it is not to be limited to the specific forms or arrangement of parts described and shown. The present embodiments are therefore to be considered in all respects as illustrative and not restrictive. Accordingly, the spirit and scope of the present invention is to be construed broadly.

The invention claimed is:

1. A method of improving the performance of an electro-acoustic transducer, comprising the steps of:
   generating an acoustic test signal through the electro-acoustic transducer;
   measuring the acoustic test signal at multiple points on an ambient surface around the electro-acoustic transducer to create measured acoustic data;
   calculating an acoustic power frequency response of the electro-acoustic transducer based on the measured acoustic data; and
   determining a correction impulse response for the electro-acoustic transducer based on the acoustic power frequency response.

2. The method of claim 1, further comprising the step of applying the correction impulse response to a sound signal input to generate a sound signal output for playback through the electro-acoustic transducer.

3. The method of claim 2, wherein the step of applying the correction impulse response comprises the step of performing a convolution operation between the correction impulse response and the sound signal input.

4. The method of claim 1, wherein the generating step comprises the step of generating the acoustic test signal of duration of 0.05 to 3.2 seconds.

5. The method of claim 1, wherein the measuring step is performed at the interval of 0.2 to 3.2 seconds for each of the multiple points.

6. The method of claim 1, wherein the measuring step comprises the step of moving a measuring device through the multiple points on the ambient surface around the electro-acoustic transducer.

7. The method of claim 1, wherein the calculating step comprises the steps of:
   calculating an impulse response of the electro-acoustic transducer based on the measured acoustic data;
   determining a frequency sample array based on the impulse response; and
   calculating the acoustic power frequency response of the electro-acoustic transducer based on the frequency sample array.

8. The method of claim 7, further comprising the step of processing the impulse response by a Window function prior to performing the step of determining a frequency sample array.

9. The method of claim 8, wherein the width of the Window function is between 0.04 seconds and 0.12 seconds.

10. The method of claim 7, wherein the step of calculating an impulse response comprises the step of performing a convolution operation between, the measured acoustic data and an inverse spectrum function.

11. The method of claim 7, further comprising the step of eliminating small irregularities and interference effects in the acoustic power frequency response.

12. The method of claim 7, further comprising the step of determining a correction level at the range ends of the acoustic power frequency response.

13. The method of claim 1, wherein the determining step comprises the steps of;
   correcting the phase of the acoustic power frequency response;
   calculating an inverse value of the corrected acoustic power frequency response;
   acquiring a finite impulse response by processing the inverse value of the corrected acoustic power frequency response; and
   processing the finite impulse response to generate the correction impulse response.

14. The method of claim 13, wherein the step of correcting the phase of the acoustic power frequency response comprises the steps of:
   calculating an average value of synchronized impulse response based on the impulse response;
   determining a group delay time based on the average value of the synchronized impulse response;
   processing the group delay time to determine a phase frequency response and
   multiplying the acoustic power frequency response with the phase frequency response in complex form.

15. The method of claim 1, further comprising the step of displaying the acoustic power frequency response of the electro-acoustic transducer.

16. The method of claim 1, further comprising the step of smoothing the acoustic power frequency response in scale of logarithmic frequency.

17. The method of claim 16, wherein the smoothing step comprises the step of applying a smoothing function of cosine impulse.

18. The method of claim 1, wherein, in the presence of a dominating lower horizontal reflective surface in an acoustic environment, the ambient surface lies perpendicular to the direction to the electro-acoustic transducer and one side of the ambient surface collides with the lower horizontal reflective surface.

19. The method of claim 1, wherein, in the presence of several dominating surfaces in an acoustic environment, the multiple points on the ambient surface are selected from lines connecting randomly chosen point on the lower horizontal reflective surface with randomly chosen point on every other dominating reflective surface.

20. The method of claim 1, wherein, in the presence of complicated surfaces in an acoustic environment, the multiple points on the ambient surface are selected from an imaginary circle placed in a vertical plane, athwart the direction to the electro-acoustic transducer, and along the horizontal diameter and vertical diameter of the imaginary circle.

21. The method of claim 1, wherein, in the presence of parallel walls in a room, the multiple points on the ambient surface are selected from lines connecting the symmetry centre of the room to the corners of the room.

22. A device for improving the performance of an electro-acoustic transducer, comprising:
   a measuring section for measuring acoustic test signals from the electro-acoustic transducer at multiple points on an ambient surface around the electro-acoustic transducer to create measured acoustic data;
   a measurement processing section for calculating an acoustic power frequency response of the electro-acoustic transducer based on the measured acoustic data from the measuring section, and processing the acoustic power frequency response to generate a correction impulse response; and
   a correction filter for applying the correction impulse response to a sound signal input to generate a sound signal output for playback through the electro-acoustic transducer.

23. The device of claim 22, wherein the measuring section comprises:
   a measuring device for receiving the acoustic test signals;
   an amplifier; and
   a memory for storing the measured acoustic data.

24. The device of claim 22, wherein the measurement processing section comprises:
   an impulse response calculator for calculating an impulse response at each of the multiple points on an ambient surface around the electro-acoustic transducer based on the measured acoustic data from the measuring section;
   a Fast Fourier Transform calculator for determining frequency sample arrays based on the impulse responses;
   an acoustic power frequency response calculator for calculating the acoustic power frequency response of the electro-acoustic transducer based on the frequency sample arrays;
   a frequency response phase adjustor for correcting the phase of the acoustic power frequency response;
   an inverter for calculating an inverse value of the corrected acoustic power frequency response;
   an acoustic power frequency response sample filtration block for acquiring a finite impulse response based on the inverse value of the corrected acoustic power frequency response; and
   a block for processing the finite impulse response to generate the correction impulse response.

25. The device of claim 22, wherein the correction filter comprises:
   a control section for receiving and storing the correction impulse response; and
   a realization block for performing a convolution operation between the correction impulse response and the sound signal input to generate the sound signal output.

26. The device of claim 24, wherein the measurement processing section further comprises a Window function processor for applying a Window function to the impulse responses from the impulse response calculator to exclude interference effects, and forwarding the processed impulse responses to the Fast Fourier Transform calculator.

27. The device of claim 24, wherein the impulse response calculator is configured to perform a convolution operation between the measured acoustic data from the measuring section and an inverse spectrum function to generate the impulse responses.

28. The device of claim 24, wherein the measurement processing section further comprises an acoustic power frequency response smoothing block for eliminating small irregularities and interference effects in the acoustic power frequency response.

29. The device of claim 24, wherein the frequency response phase adjustor comprises:
- a block for calculating an average value of synchronized impulse response based on the impulse responses;
- a block for determining a group delay time based on the average value of the synchronized impulse response;
- a block for processing the group delay time to generate a phase frequency response; and
- a block for multiplying the acoustic power frequency response with the phase frequency response in complex form.

30. The device of claim 22, further comprising a display for displaying the acoustic power frequency response of the electro-acoustic transducer.

* * * * *